(12) United States Patent
Lin et al.

(10) Patent No.: US 9,048,394 B2
(45) Date of Patent: Jun. 2, 2015

(54) LIGHT EMITTING DIODE PACKAGE WITH OXIDATION-RESISTANT METAL COATING LAYER

(71) Applicant: ADVANCED OPTOELECTRONIC TECHNOLOGY, INC., Hsinchu Hsien (TW)

(72) Inventors: Hou-Te Lin, Hsinchu (TW); Chao-Hsiung Chang, Hsinchu (TW); Pin-Chuan Chen, Hsinchu (TW); Lung-Hsin Chen, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/077,218

(22) Filed: Nov. 12, 2013

(65) Prior Publication Data
US 2014/0209948 A1 Jul. 31, 2014

(30) Foreign Application Priority Data
Jan. 29, 2013 (CN) .......................... 2013 1 0033366

(51) Int. Cl.
H01L 33/00 (2010.01)
H01L 33/48 (2010.01)
H01L 33/62 (2010.01)
H01L 33/60 (2010.01)

(52) U.S. Cl.
CPC ............... *H01L 33/486* (2013.01); *H01L 33/60* (2013.01); *H01L 33/62* (2013.01); *H01L 2924/0002* (2013.01)

(58) Field of Classification Search
CPC ...................................................... H01L 33/62
USPC ............................................................ 257/99
See application file for complete search history.

(56) References Cited

U.S. PATENT DOCUMENTS

2009/0321778 A1* 12/2009 Chen et al. ....................... 257/99
2013/0001633 A1* 1/2013 Imai et al. ........................ 257/99

* cited by examiner

*Primary Examiner* — Colleen A Matthews
*Assistant Examiner* — Christopher Johnson
(74) *Attorney, Agent, or Firm* — Novak Druce Connolly Bove + Quigg LLP

(57) ABSTRACT

An exemplary light emitting diode (LED) package includes a substrate, a first electrode and a second electrode embedded in the substrate and spaced from each other, and an LED die mounted on a top surface of the substrate. The substrate also includes a bottom surface. Top ends of the first and second electrodes are exposed at the top surface of the substrate, and bottom ends of the first and second electrodes are exposed at the bottom surface of the substrate. An oxidation-resistant metal coating layer is formed on a top face of each of the first and second electrodes. The LED die is electrically connected to the first and second electrodes via the two oxidation-resistant metal coating layers.

20 Claims, 3 Drawing Sheets

LIGHT EMITTING DIODE PACKAGE WITH OXIDATION-RESISTANT METAL COATING LAYER

TECHNICAL FIELD

The present disclosure relates generally to a light emitting diode (LED) package with an oxidation-resistant metal coating layer formed on at least one of two electrodes thereof.

DESCRIPTION OF RELATED ART

LEDs are solid state light emitting devices formed of semiconductors. LEDs are more stable and reliable than other conventional light sources such as incandescent bulbs. Thus, LEDs are being widely used in various fields such as numeral/character displaying elements, signal lights, and lighting and display devices.

A traditional LED package usually includes a substrate, a first electrode formed on the substrate, a second electrode formed on the substrate and spaced from the first electrode, and an LED die mounted on the substrate and electrically connected to the first and second electrodes. In order to prolong a life-span of the LED package, it is common to form an encapsulation layer on the substrate to encapsulate the LED die mounted on the substrate, whereby the LED die of the LED package is isolated from humid ambient air.

However, humid air may still easily permeate into the inside of the LED package through the substrate-encapsulation layer interface, due to weak bonding between the encapsulation layer and the substrate. Permeation is particularly common when the encapsulation layer is made of material such as silicon resin or epoxy resin, whereby a contact area between the first or the second electrode and the LED die is prone to oxidation by the humid air. That is, such kind of the LED package has low oxidation resistance. Furthermore, when there is oxidation, it is difficult for heat generated by the LED die to be dissipated. Buildup of heat may greatly accelerate deterioration and degradation of the LED package.

What is needed, therefore, is an LED package which can overcome the above mentioned limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Figure 1:
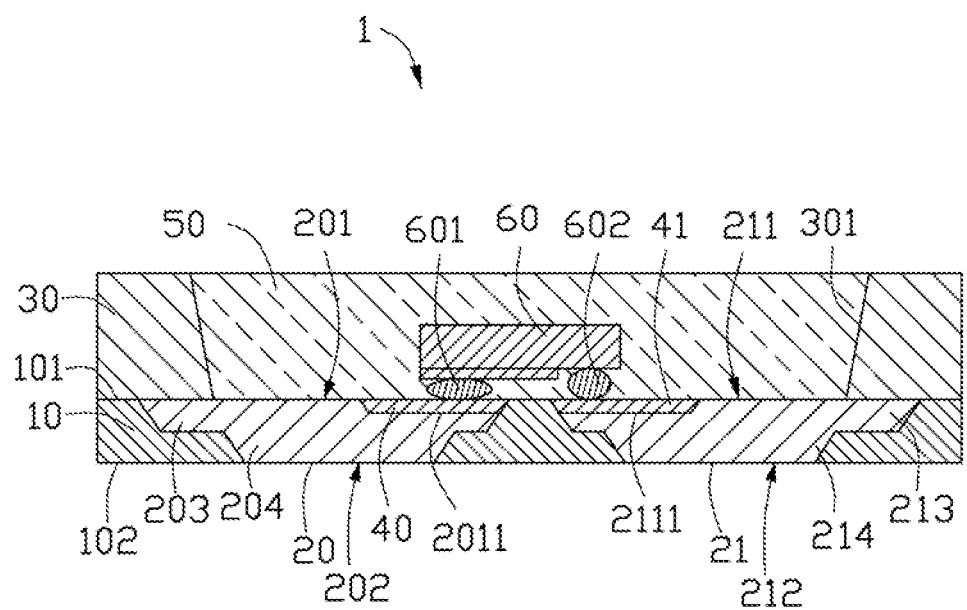
FIG. 1 is a schematic, cross-sectional view of a light emitting diode (LED) package in accordance with a first embodiment of the present disclosure.
Figure 2:
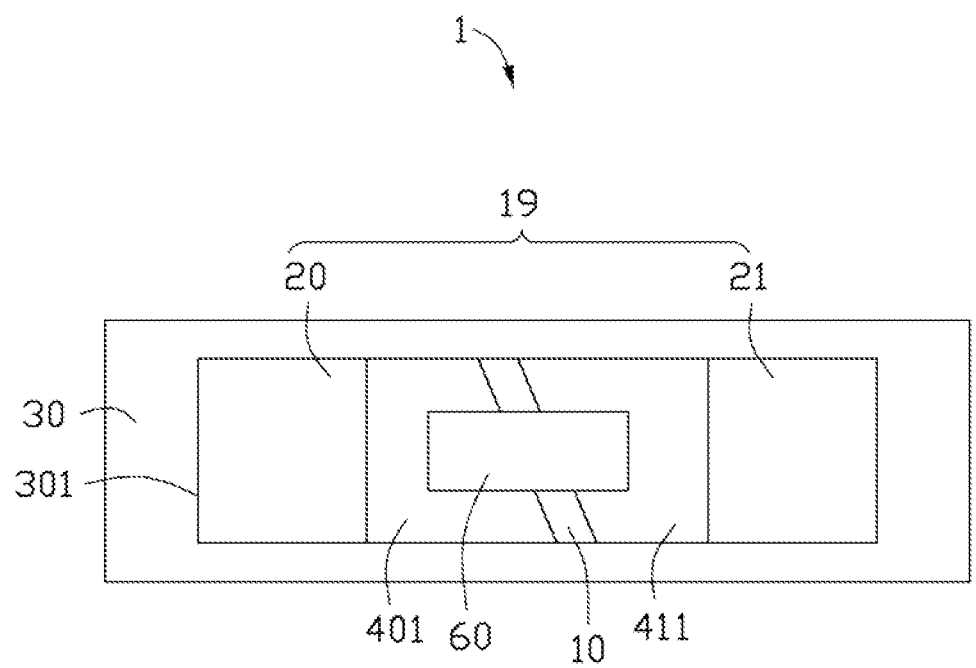
FIG. 2 is a top plan view of the LED package of FIG. 1.

Referring to FIGS. 1 and 2, a light emitting diode (LED) package 1 in accordance with a first embodiment of the present disclosure includes a substrate 10, a first electrode 20 embedded in the substrate 10, a second electrode 21 embedded in the substrate 10 and spaced from the first electrode 20, an LED die 60 mounted on a top surface 101 of the substrate 10 and electrically connected to the first and second electrodes 20, 21, a reflective cup 30 formed on the top surface 101 of the substrate 10 and surrounding the LED die 60, and an encapsulation layer 50 covering the top surface 101 of the substrate 10 and encapsulating the LED die 60. The first and second electrodes 20, 21 constitute an electrode pair 19.

The substrate 10 includes a top surface 101 and a bottom surface 102 at opposite sides thereof. In the present embodiment, the substrate 10 is rectangular, and both the top and bottom surfaces 101, 102 of the substrate 10 are horizontal surfaces which are in parallel with each other. The substrate 10 is a highly heat conductive insulated substrate, which is made of a material such as silicon (Si) resin or ceramic. Thus the substrate 10 is electrically insulated from the first and second electrodes 20, 21.

The first and second electrodes 20, 21 penetrate downward through the substrate 10 from the top surface 101 to the bottom surface 102, respectively. The first electrode 20 includes a top face 201 and a bottom face 202 at opposite sides thereof. The second electrode 21 includes a top face 211 and a bottom face 212 at opposite sides thereof. Both the top face 201 of the first electrode 20 and the top face 211 of the second electrode 21 are exposed at the top surface 101 of the substrate 10. Both the bottom face 202 of the first electrode 20 and the bottom face 212 of the second electrode 21 are exposed at the bottom surface 102 of the substrate 10.

In the present embodiment, both the top face 201 of the first electrode 20 and the top face 211 of the second electrode 21 are coplanar with the top surface 101 of the substrate 10, and both the bottom face 202 of the first electrode 20 and the bottom face 212 of the second electrode 21 are coplanar with the bottom surface 102 of the substrate 10. Alternatively, a top end of each of the first and second electrodes 20, 21 protrudes upwardly from the top surface 101 of the substrate 10, and a bottom end of each of the first and second electrodes 20, 21 protrudes downwardly from the bottom surface 102 of the substrate 10.

The first and second electrodes 20, 21 each have a generally T-shaped transverse cross-section along a thickness direction thereof. In detail, the first electrode 20 includes a rectangular main body 203, and an inverted circular frustum-shaped branch portion 204 extending downwardly from a central region of a bottom face of the main body 203. The second electrode 21 includes a rectangular main body 213, and an inverted circular frustum-shaped branch portion 214 extending downwardly from a central region of a bottom face of the main body 213.

The reflective cup 30 defines a receiving cavity 301 therein. The LED die 60 is received in the receiving cavity 301 and surrounded by the reflective cup 30. A lateral outer periphery of the reflective cup 30 is aligned with a lateral periphery of the substrate 10. In the present embodiment, the reflective cup 30 is integrally formed with the substrate 10 as a monolithic piece by injection molding. Alternatively, the reflective cup 30 and the substrate 10 are separately molded, and then combined into one integrated piece. It is preferred that the reflective cup 30 is made of a material such as silicon resin or epoxy resin.

The top face 201 of the first electrode 20 and the top face 211 of the second electrode 21 are rectangular. A majority of the top face 201 of the first electrode 20 is exposed at a bottom of the receiving cavity 301 of the reflective cup 30, with a left-side portion of the top face 201 being covered by the reflective cup 30. A majority of the top face 211 of the second electrode 21 is exposed at the bottom of the receiving cavity 301 of the reflective cup 30, with a right-side portion of the top face 211 being covered by the reflective cup 30. That is, a short side of the top face 201 of the first electrode 20 away from the second electrode 21 and a short side of the top face 211 of the second electrode 21 away from the first electrode 20 are covered by the reflective cup 30, respectively.

The encapsulation layer 50 is formed in the receiving cavity 301 of the reflective cup 30 and encapsulates the LED die 60 therein. The encapsulation layer 50 completely fills the receiving cavity 301. It is preferred that the encapsulation layer 50 contains phosphor particles distributed therein to scatter and convert a wavelength of light rays emitted from the LED die 60.

The top face 201 of the first electrode 20 defines a first cutout 2011 in an inner edge portion thereof. An oxidation-resistant metal coating layer 40 is filled in the first cutout 2011 of the first electrode 20. The top face 211 of the second electrode 21 defines a second cutout 2111 in an inner edge portion thereof. An oxidation-resistant metal coating layer 41 is filled in the second cutout 2111 of the second electrode 21. A top face 401 of the oxidation-resistant metal coating layer 40 and a top face 411 of the oxidation-resistant metal coating layer 41 are coplanar with the top surface 101 of the substrate 10.

The first cutout 2011 is located near a joint of the first electrode 20 and the substrate 10. The second cutout 2111 is located near a joint of the second electrode 21 and the substrate 10. In detail, the first cutout 2011 is located at a right-side portion of the top face 201 of the first electrode 20 near the second electrode 21, with three sides of the first cutout 2011 being surrounded by the substrate 10. The second cutout 2111 is located at a left-side portion of the top face 211 of the second electrode 21 near the first electrode 20, with three sides of the second cutout 2111 being surrounded by the substrate 10. The first and second cutouts 2011, 2111 are trapezoidal as viewed from tops thereof. The first cutout 2011 has a width equal to that of the first electrode 20 along a width direction of the substrate 10 (i.e. a direction from top to bottom in FIG. 2). The second cutout 2111 has a width equal to that of the second electrode 21 along the width direction of the substrate 10. The oxidation-resistant layer 40 filled in the first cutout 2011 and the oxidation-resistant layer 41 filled in the second cutout 2111 are exposed at the bottom of the receiving cavity 301 of the reflective cup 30, respectively.

The LED die 60 includes a positive bonding pad (i.e., a P-pad; not shown) and a negative bonding pad (i.e., an N-pad; not shown) spaced from the positive bonding pad. The positive and negative bonding pads are located at a same side of the LED die 60. The LED package 1 further includes a first conductive bump 601 and a second conductive bump 602. The first conductive bump 601 extends between the LED die 60 and the oxidation-resistant metal coating layer 40 filled in the first cutout 2011. The second conductive bump 602 extends between the LED die 60 and the oxidation-resistant metal coating layer 41 filled in the second cutout 2111.

The LED die 60 is inverted, insofar as the positive and negative bonding pads are located at a bottom thereof. The first conductive bump 601 electrically connects the positive bonding pad of the LED die 60 to the oxidation-resistant metal coating layer 40 filled in the first cutout 2011. The second conductive bump 602 electrically connects the negative bonding pad of the LED die 60 to the oxidation-resistant metal coating layer 41 filled in the second cutout 2111. In the present embodiment, the oxidation-resistant metal coating layers 40, 41 are made of gold (Au), and the conductive bumps 601, 602 are made of tin-based (Sn-based) alloys. The oxidation-resistant metal coating layer 40 on the first electrode 20 and the conductive bump 601 are joined together by eutectic bonding to form a eutectic layer (not labeled). The oxidation-resistant metal coating layer 41 on the second electrode 21 and the conductive bump 602 are joined together by eutectic bonding to form a eutectic layer (not labeled).

As described above, the first and second electrodes 20, 21 are embedded in the substrate 10, and the first and second electrodes 20, 21 have a T-shaped transverse cross-section. Accordingly, a linear path anywhere along which humid air might enter a joint(s) of the electrode pair 19 and the substrate 10 is greatly extended. Thereby, deterioration of the LED package 1 due to infiltration of humid air into the joint(s) is effectively delayed. That is, a rate of deterioration of the LED package 1 is reduced. Furthermore, contact between the first electrode 20 and the conductive bump 601 is enhanced by the oxidation-resistant metal coating layer 40 interposed therebetween. Similarly, contact between the second electrode 21 and the conductive bump 602 is enhanced by the oxidation-resistant metal coating layer 41 interposed therebetween. Accordingly, a contact area from the first electrode 20 to the LED die 60 has improved oxidation resistance, and a contact area from the second electrode 21 to the LED die 60 has improved oxidation resistance. Furthermore, the bottom face 202 of the first electrode 20 and the bottom face 212 of the second electrode 21 are exposed at the bottom surface 102 of the substrate 10. Therefore heat generated by the LED die 60 is effectively dissipated to the ambient environment through the bottom faces 202, 212.

Figure 3:
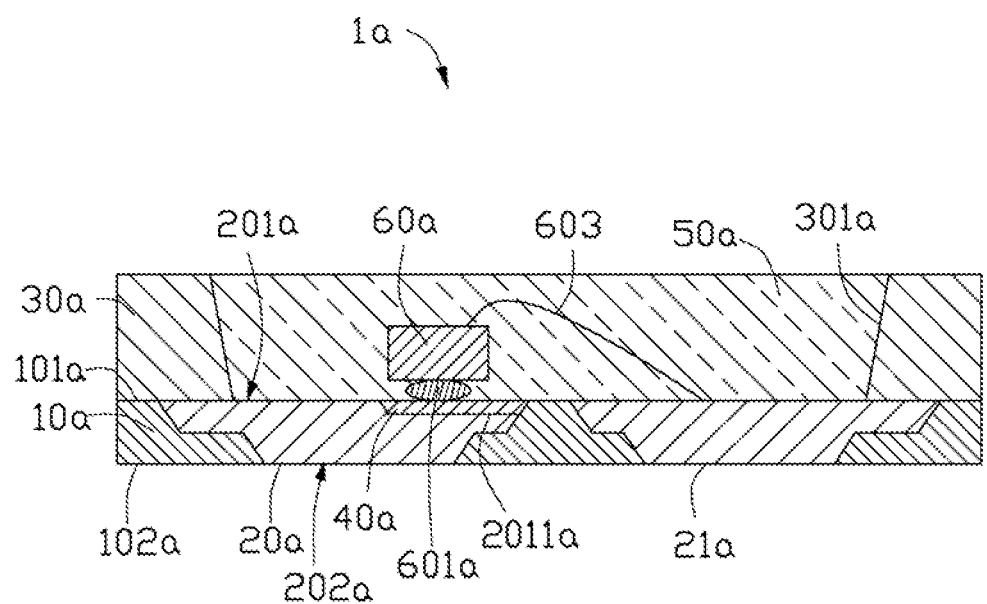
FIG. 3 is a schematic, cross-sectional view of a light emitting diode (LED) package in accordance with a second embodiment of the present disclosure.

Referring to FIG. 3, a light emitting diode (LED) package 1a in accordance with a second embodiment of the present disclosure is illustrated. Different from the LED package 1 as shown in FIG. 1, in the LED package 1a, positive and negative bonding pads of an LED die 60a are located at two opposite sides of the LED die 60a, and only a top face 201a of a first electrode 20a defines a cutout 2011a. An oxidation-resistant metal coating layer 40a is filled in the cutout 2011a. A conductive bump 601a extends between the positive bonding pad of the LED die 60a and the oxidation-resistant metal coating layer 40a. The conductive bump 601a electrically interconnects the positive bonding pad of the LED die 60a and the oxidation-resistant metal coating layer 40a. The negative bonding pad of the LED die 60a is electrically connected to a second electrode 21a through a wire 603.

It is understood that in the above-described embodiments, the conductive bumps 601 (601a), 602 are optional. That is, the positive and negative bonding pads of the LED die 60 (60a) can be directly electrically connected to the first and second electrodes 20, 21 (20a, 21a) via the oxidation-resistant layers 40 (40a), 41 without any need for the conductive bumps 601 (601a), 602.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments.

What is claimed is:

1. A light emitting diode (LED) package comprising:
   a substrate, comprising a top surface and a bottom surface at opposite sides thereof;
   a first electrode and a second electrode spaced from the first electrode, both the first and second electrodes penetrating downwardly through the substrate from the top surface to the bottom surface, a top face of each of the first and second electrodes being exposed at the top surface of the substrate, and a bottom face of each of the first and second electrodes being exposed at the bottom surface of the substrate; and an LED die arranged on the top surface of the substrate and electrically connected to the first and second electrodes, the LED die comprising a positive bonding pad and a negative bonding pad;

wherein a cutout is defined on an edge portion of the top face of at least one of the first and second electrodes, an oxidation-resistant metal coating layer is filled in the cutout of the at least one of the first and second electrodes and directly contacts the substrate, and at least one of the positive and negative bonding pads of the LED die is electrically connected to a corresponding one of the first and second electrodes via the oxidation-resistant metal coating layer.

2. The LED package of claim 1, wherein the oxidation-resistant metal coating layer is formed on the top face of each of the first and second electrodes, and the positive and negative bonding pads of the LED die are electrically connected to the first and second electrodes via the two oxidation-resistant metal coating layers, respectively.

3. The LED package of claim 2, further comprising a first conductive bump extending between the LED die and the oxidation-resistant metal coating layer formed on the first electrode, and a second conductive bump extending between the LED die and the oxidation-resistant metal coating layer formed on the second electrode, wherein the first conductive bump electrically connects the positive bonding pad of the LED die to the oxidation-resistant metal coating layer formed on the first electrode, and the second conductive bump electrically connects the negative bonding pad of the LED die to the oxidation-resistant metal coating layer formed on the second electrode.

4. The LED package of claim 2, wherein the top face of each of the first and second electrodes is coplanar with the top surface of the substrate.

5. The LED package of claim 4, wherein the bottom face of each of the first and second electrodes is coplanar with the bottom surface of the substrate.

6. The LED package of claim 4, further comprising a reflective cup provided on the top face of the substrate, the reflective cup defining a receiving cavity, and the LED die being received in the receiving cavity and surrounded by the reflective cup.

7. The LED package of claim 6, wherein the top face of each of the first and second electrodes is rectangular, and a majority of the top face of each of the first and second electrodes is exposed at a bottom of the receiving cavity, with a side portion of the top face of each of the first and second electrodes being covered by the reflective cup.

8. The LED package of claim 7, wherein the substrate is rectangular, and a lateral outer periphery of the reflective cup is aligned with a lateral periphery of the substrate.

9. The LED package of claim 6, further comprising an encapsulation layer formed in the reflective cup, the encapsulation layer encapsulating the LED die therein.

10. The LED package of claim 6, wherein the reflective cup is integrally formed with the substrate as a monolithic piece.

11. The LED package of claim 6, wherein the cutout is defined on the edge portion of the top face of each of the first and second electrodes, and the two oxidation-resistant metal coating layers are filled in the cutouts of the first and second electrodes, respectively.

12. The LED package of claim 11, wherein top faces of the two oxidation-resistant metal coating layers are coplanar with the top faces of the first and second electrodes, respectively.

13. The LED package of claim 11, wherein the cutout of the first electrode is located at a joint of the first electrode and the substrate, and the cutout of the second electrode is located at a joint of the second electrode and the substrate.

14. The LED package of claim 13, wherein the cutout of the first electrode is located at a side of the top face of the first electrode near the second electrode, the cutout of the second electrode is located at a side of the top face of the second electrode near the first electrode, and three sides of the cutout of each of the first and second electrodes are surrounded by the substrate.

15. The LED package of claim 11, wherein each of the first and second electrodes has a generally T-shaped transverse cross-section along a thickness direction thereof.

16. The LED package of claim 15, wherein each of the first and second electrodes comprises a rectangular main body and an inverted circular frustum-shaped branch portion extending downwardly from a central region of a bottom face of the main body.

17. The LED package of claim 1, wherein the oxidation-resistant metal coating layer is formed on the top face of the first electrode, the positive bonding pad of the LED die is electrically connected to the first electrode via the oxidation-resistant metal coating layer, and the negative bonding pad of the LED die is directly electrically connected to the second electrode by a wire.

18. The LED package of claim 17, further comprising a conductive bump located between the positive bonding pad and the oxidation-resistant metal coating layer formed on the top face of the first electrode, wherein the conductive bump electrically interconnects the positive bonding pad of the LED die and the oxidation-resistant metal coating layer.

19. The LED package of claim 17, wherein the top face of the first electrode defines a cutout therein, the oxidation-resistant metal coating layer is filled in the cutout, and a top face of the oxidation-resistant metal coating layer is coplanar with the top face of each of the first and second electrodes.

20. The LED package of claim 1, wherein the oxidation-resistant metal coating layer is made of gold.

* * * * *